United States Patent
Kubokawa et al.

(10) Patent No.: US 11,874,339 B2
(45) Date of Patent: Jan. 16, 2024

(54) INSULATION RESISTANCE DETERMINATION APPARATUS

(71) Applicant: DENSO CORPORATION, Kariya (JP)

(72) Inventors: Ryota Kubokawa, Kariya (JP); Masakazu Kouda, Kariya (JP); Toru Wakimoto, Nisshin (JP); Yusuke Shindo, Kariya (JP); Akira Sumi, Kariya (JP)

(73) Assignee: DENSO CORPORATION, Kariya (JP)

(*) Notice: Subject to any disclaimer, the term of this patent is extended or adjusted under 35 U.S.C. 154(b) by 302 days.

(21) Appl. No.: 17/337,957

(22) Filed: Jun. 3, 2021

(65) Prior Publication Data

US 2021/0293896 A1 Sep. 23, 2021

Related U.S. Application Data

(63) Continuation of application No. PCT/JP2019/044960, filed on Nov. 15, 2019.

(30) Foreign Application Priority Data

Dec. 3, 2018 (JP) .................................. 2018-226824

(51) Int. Cl.
  *G01R 31/52* (2020.01)
  *G01R 27/18* (2006.01)

(52) U.S. Cl.
  CPC ............. *G01R 31/52* (2020.01); *G01R 27/18* (2013.01)

(58) Field of Classification Search
  CPC ........ G01R 31/52; G01R 31/40; G01R 27/18; G01R 27/025
  See application file for complete search history.

(56) References Cited

U.S. PATENT DOCUMENTS

| | | | | |
|---|---|---|---|---|
| 10,175,288 | B2 * | 1/2019 | Pritelli | ................. G01R 31/006 |
| 2005/0073317 | A1 * | 4/2005 | Yamamoto | ............. G01R 35/00 361/45 |
| 2007/0132459 | A1 * | 6/2007 | Yamamoto | ............... H02H 3/17 324/541 |
| 2008/0197855 | A1 * | 8/2008 | Uchida | .................. G01R 31/12 324/509 |
| 2009/0134881 | A1 * | 5/2009 | Tachizaki | .............. B60L 3/0023 324/551 |
| 2009/0153156 | A1 * | 6/2009 | Ishii | ....................... G01R 27/18 324/704 |
| 2012/0280697 | A1 * | 11/2012 | Morimoto | ............. B60L 3/0069 324/606 |

(Continued)

FOREIGN PATENT DOCUMENTS

JP 2009-300400 A 12/2009

*Primary Examiner* — Patrick Assouad
*Assistant Examiner* — Demetrius R Pretlow
(74) *Attorney, Agent, or Firm* — Oliff PLC

(57) ABSTRACT

In an insulation resistance detection apparatus, a voltage determiner determines whether a detection voltage, which has changed by at least a preset value, becomes stable at around a changed voltage value. A resistance determiner determines a value of an insulation resistance between a ground portion and a power-supply path based on a currently sampled value of the detection voltage instead of a moving average in response to determination that the detection voltage, which has changed by at least the preset value, becomes stable at around the changed voltage value.

13 Claims, 9 Drawing Sheets

(56) References Cited

U.S. PATENT DOCUMENTS

| | | | | |
|---|---|---|---|---|
| 2014/0002096 A1* | 1/2014 | Mizoguchi | ............. | G01R 27/18 |
| | | | | 324/503 |
| 2016/0377670 A1* | 12/2016 | Tamida | ................. | G01R 31/52 |
| | | | | 324/551 |
| 2019/0077266 A1* | 3/2019 | Albert | ..................... | B60L 50/62 |
| 2020/0116775 A1* | 4/2020 | Wakimoto | ............ | G01R 31/50 |
| 2020/0158784 A1* | 5/2020 | Fabregas | ................... | B60L 3/04 |
| 2021/0293865 A1* | 9/2021 | Kouda | ................... | G01R 27/18 |
| 2022/0357408 A1* | 11/2022 | Nakayama | ............ | B60L 3/0046 |

\* cited by examiner

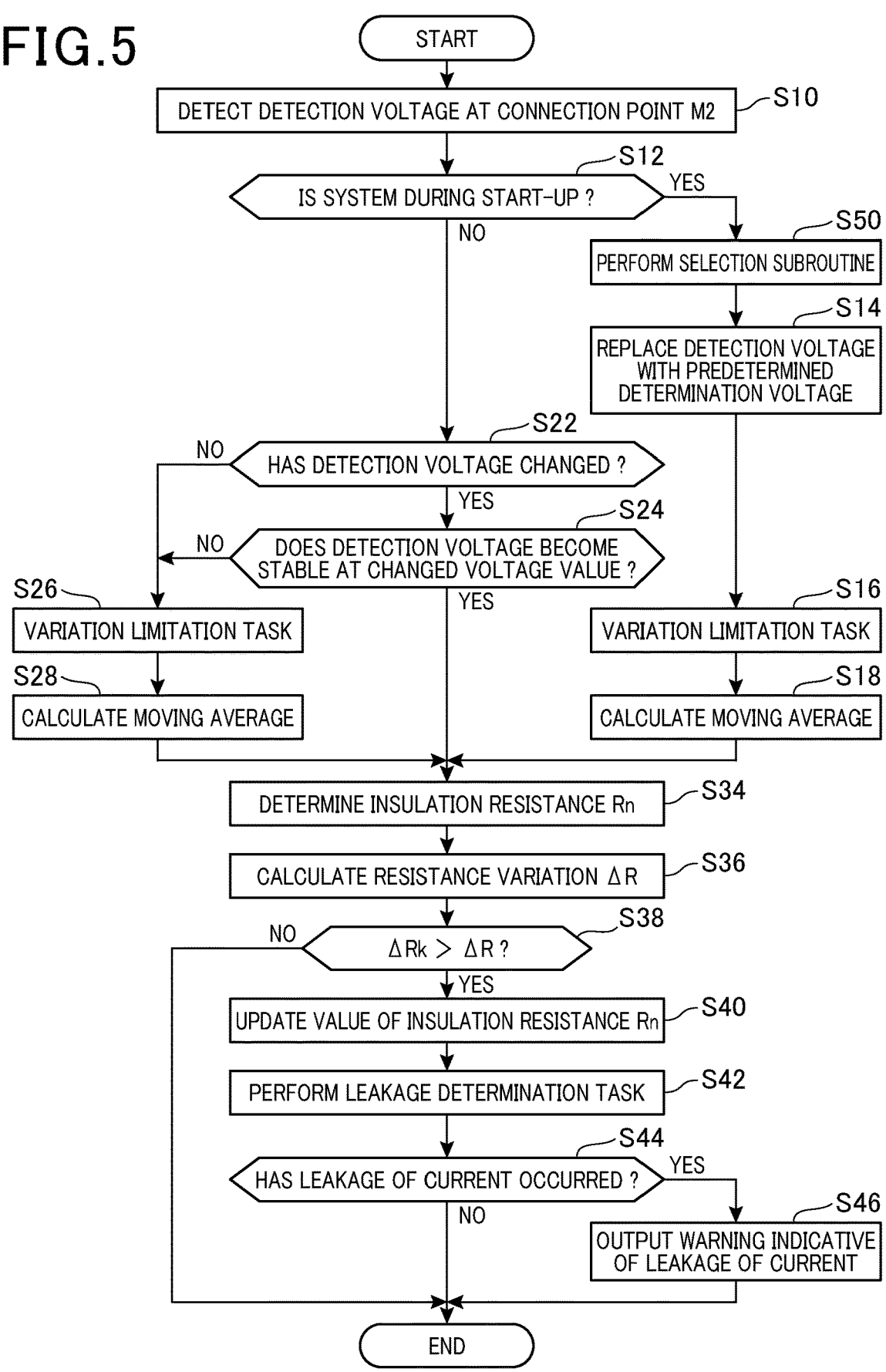

TERMINATION OF IMMEDIATELY
PREVIOUS ACTIVATED STATE OF
SYSTEM

START-UP OF SYSTEM

DETECTION VOLTAGE VD
UPON POWER-SUPPLY
VOLTAGE BEING
RELATIVELY HIGH

DETECTION VOLTAGE VD
UPON POWER-SUPPLY
VOLTAGE BEING
RELATIVELY LOW

TIME

INSULATION RESISTANCE DETERMINATION APPARATUS

CROSS-REFERENCE TO RELATED APPLICATION

This application is a bypass continuation application of currently pending international application No. PCT/JP2019/44960 filed on Nov. 15, 2019 designating the United States of America, the entire disclosure of which is incorporated herein by reference.

This application is based on and claims the benefit of priority from Japanese Patent Application No. 2018-226824 filed on Dec. 3, 2018, the entire disclosure of which is incorporated herein by reference.

TECHNICAL FIELD

The present disclosure relates to insulation resistance determination apparatuses.

BACKGROUND

A conventional insulation resistance determination apparatus determines that there is a leakage of current between an electrical system and a body of a vehicle in response to detecting a decrease in an insulation resistance therebetween.

SUMMARY

An insulation resistance detection apparatus according to an exemplary aspect of the present disclosure includes a voltage determiner and a resistance determiner. The voltage determiner is configured to determine whether a detection voltage, which has changed by at least preset value, becomes stable at around a changed voltage value. The resistance determiner is configured to determine a value of an insulation resistance between a ground portion and a power-supply path based on a currently sampled value of the detection voltage instead of a moving average in response to determination that the detection voltage, which has changed by at least the preset value, becomes stable at around the changed voltage value.

BRIEF DESCRIPTION OF THE DRAWINGS

The above object, other objects, features, and benefits of the present disclosure will become apparent from the following description of embodiments with reference to the accompanying drawings in which:

FIG. 5 is a flowchart illustrating an insulation resistance determination routine according to the second embodiment;

DETAILED DESCRIPTION OF EMBODIMENTS

Figure 1:
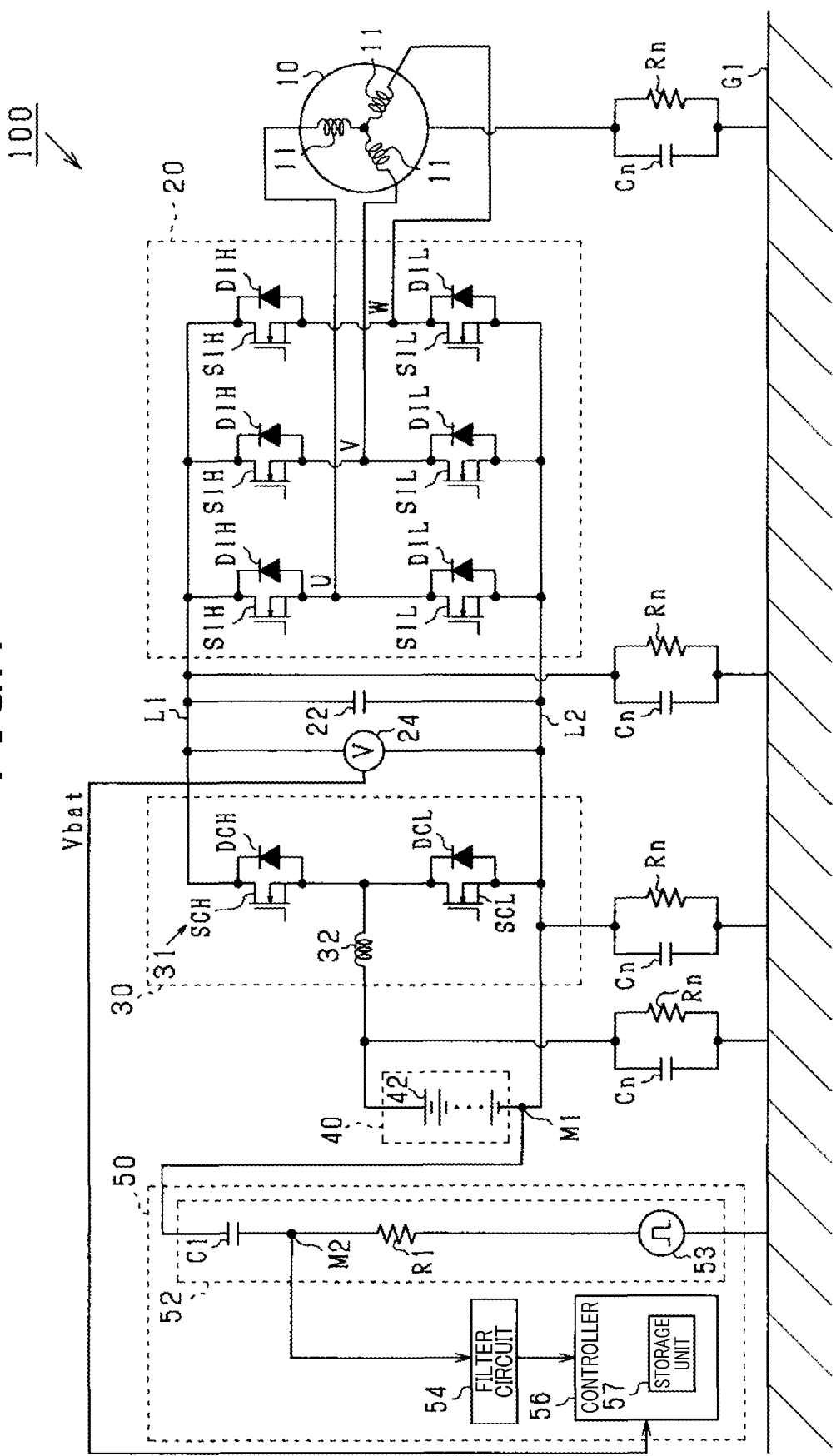
FIG. 1 is an overall structural diagram of a vehicle power system.

Japanese Patent Application Publication No. 2009-300400 discloses a conventional insulation resistance determination apparatus, which determines that there is a leakage of current between an electrical system and a body of a vehicle in response to detecting a decrease in an insulation resistance therebetween. This insulation resistance determination apparatus outputs an oscillating voltage with a predetermined frequency to a connection line connected to the electrical system, and detects a high-side peak or a low-side peak of the oscillating voltage at the connection line every predetermined processing period. Then, the insulation resistance determination apparatus calculates a value of a moving average of the detected peaks to accordingly detect a value of the insulation resistance between the electrical system and the body of the vehicle.

In particular, the insulation resistance determination apparatus disclosed in the patent publication establishes an effective voltage range based on the peaks detected at respective processing periods that are previous to a current processing period.

Then, the insulation resistance determination apparatus detects, at the current processing period, a higher or lower peak, and determines whether the detected peak is within the effective voltage range. In response to determination that the detected peak is within the effective voltage range, the insulation resistance determination apparatus calculates a new value of the moving average based on the peak detected at the current processing period and previously detected plural peaks.

This improves an accuracy of determining the insulation resistance.

As described above, calculation of a value of the moving average for each processing period requires previously detected plural peaks. Using the calculated value of the moving average for determination of a steady-state value of the insulation resistance enables the detected steady-state value of the insulation resistance to have a higher accuracy independently of, for example, noise.

Using the moving average for determination of a steady-state value of the insulation resistance may however result in a longer time that is required for the insulation resistance to reach a steady-state value.

For example, if a leakage of current is detected between the electrical system and the body of the vehicle, the detected peak immediately after the determination of the leakage of current sharply changes, and thereafter the detected peaks converge to a steady-state value. In contrast, because the values of the moving average gradually change after the determination of the leakage of current, a longer time may be required for the values of the moving average to converge to a steady-state value. This may therefore result in a longer time that is required for the insulation resistance to reach a steady-state value, resulting in a delay in determination of whether a leakage of current is detected between the electrical system and the body of the vehicle.

For this reason, users strongly require development of a technology that enables the insulation resistance to converge to a steady state earlier to thereby determine a proper value of the insulation resistance.

For addressing the above issue, the present disclosure aims to provide insulation resistance determination apparatuses, each of which is capable of determining a proper value of the insulation resistance.

The present disclosure provides, as a selected aspect of the present disclosure, an insulation resistance detection apparatus applicable to a power system that includes (i) a direct-current power source, (ii) a coupling capacitor having a first end and a second end, the first end of the coupling capacitor being connected to a power-supply path that is connected to the direct-current power source and is electrically isolated from a ground portion, (iii) a resistor connected to the second end of the coupling capacitor at a connection point therebetween, and (iv) an oscillator connected to the resistor and configured to output a predetermined frequency signal to the resistor.

The insulation resistance detection apparatus is configured to
1. Sample, every predetermined period, a value of a detection voltage at the connection point between the resistor and the coupling capacitor
2. Determine an insulation resistance between the ground portion and the power-supply path based on a moving average of the detection voltage
3. Determine whether the determined insulation resistance is lower than or equal to a predetermined reference value to thereby determine whether there is a leakage of current between the ground portion and the power-supply path The insulation resistance detection apparatus includes a voltage determiner configured to determine whether the detection voltage, which has changed by at least a preset value, becomes stable at around a changed voltage value. The insulation resistance detection apparatus includes a resistance determiner configured to determine a value of the insulation resistance between the ground portion and the power-supply path based on a currently sampled value of the detection voltage instead of the moving average in response to determination that the detection voltage, which has changed by the at least preset value, becomes stable at around the changed voltage value The selected aspect determines a value of the insulation resistance based on a value of the moving average accurately with little influence of, for example, noise.

The occurrence of a short-circuit between the ground portion and the power-supply path causes the detection voltage to change by at least the preset voltage, and thereafter the detection voltage becomes stable at around a changed value. In response to this change, the selected aspect is configured to determine a value of the insulation resistance based on a currently sampled value of the detection voltage instead of the moving average. This configuration enables the insulation resistance to converge to a steady state earlier even if a leakage of current has occurred, making it possible to properly determine the insulation resistance.

From this viewpoint, the following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment that embodies an insulation resistance determination apparatus 50 according to the present disclosure with reference to the accompanying drawings. The insulation resistance determination apparatus 50 according to the first embodiment is installed in a vehicle.

Referring to FIG. 1, a vehicle power system 100 according to the first embodiment includes a rotary electric machine 10, an inverter 20, a converter 30, a direct-current (DC) power source 40, and the insulation resistance determination apparatus 50. The rotary electric machine 10 according to the first embodiment, which is, for example, a synchronous rotary electric machine, includes a rotor and three-phase windings 11 connected to each other in star-configuration. The rotor is joined to driving wheels of the vehicle such that rotational power is transferable between the rotor 10 and the driving wheels.

The rotary electric machine 10 is connected to the DC power source 40 through the inverter 20 and the converter 30. The DC power source 40 of the first embodiment is a chargeable storage battery, and is comprised of a plurality of battery cells 42 connected in series to each other. As each cell, a lithium-ion battery cell or nickel-hydrogen battery cell can be used.

The inverter 20 includes
(1) A first series circuit comprised of series-connected upper- and lower-arm switches SIH and SIL for the U-phase
(2) A second series circuit comprised of series-connected upper- and lower-arm switches SIH and SIL for the V-phase
(3) A third series circuit comprised of series-connected upper- and lower-arm switches SIH and SIL for the W-phase The first embodiment uses a unipolar SiC N-channel MOSFET as each upper-arm switch SIH and each lower-arm switch SIL. Each upper-arm switch SIH includes an upper-arm diode as an intrinsic diode, and each lower-arm switch SIL includes a lower-arm diode as an intrinsic diode.

The inverter 20 is connected to the rotary electric machine 10 and converter 30. Specifically, each of the phase windings 11 of the rotary electric machine 10 has opposing first and second ends, and the first end of each phase winding 11 is connected to the connection point between the corresponding phase upper-arm switch SIH and the corresponding phase lower-arm switch SIL. The second ends of the respective each phase windings 11 are connected to each other at a neutral point.

The converter 30 is designed as a booster DC-DC converter configured to boost a power-supply voltage Vbat of the DC power source 40, and output a boosted power supply voltage Vbat to the inverter 20. The converter 30 is comprised of an upper-arm transformer switch SCH and a lower-arm transformer switch SCL connected in series to each other, and of a smoothing inductor, i.e., reactor, 32. The first embodiment uses a unipolar SiC N-channel MOSFET as each upper-arm switch SIH and each lower-arm switch SIL. The upper-arm transformer switch SCH is comprised of an upper-arm transformer diode as an intrinsic diode, and each lower-arm transformer switch SCL is comprised of a lower-arm transformer diode as an intrinsic diode.

Each of the upper- and lower-arm switches SIH and SIL has a drain and a source, and similarly each of the upper- and lower-arm transformer switches SCH and SCL has a drain and a source. The smoothing inductor 32 has opposing first and second ends. The DC power source 40 has opposing positive and negative terminals.

The drain of each phase upper-arm switch SIH of the inverter 20 is connected to the drain of the upper-arm transformer switch SCH. The source of the upper-arm transformer switch SCH is connected to the drain of the lower-arm transformer switch SCL at a connection point, and the connection point between the source of the upper-arm transformer switch SCH and the drain of the lower-arm transformer switch SCL is connected to the first end of the smoothing inductor 32. The second end of the smoothing inductor 32 is connected to the positive terminal of the DC power source 40.

The negative terminal of the DC power source 40 and the source of each phase lower-arm switch SIL of the inverter 20 are connected to the source of the lower-arm transformer switch SCL.

The vehicle power system 100 includes a smoothing capacitor 22 and a power-supply voltage detector 24. The smoothing capacitor 22 is arranged between the drain of the upper-arm transformer switch SCH of the converter 30 and the source of the lower-arm transformer switch SCL. The power-supply voltage detector 24 is configured to detect a terminal voltage across the smoothing capacitor 22 as the power supply voltage Vbat.

The vehicle power system 100 includes a positive power-supply path L1 connected to the positive terminal of the DC power source 40. To the positive power-supply path L1, a positive terminal of an electrical load, such as the drain of the upper-arm transformer switch SCH of the converter 30, is connected. Similarly, the vehicle power system 100 includes a negative power-supply path L2 connected to the negative terminal of the DC power source 40. To the negative power-supply path L2, a negative terminal of the electrical load, such as the source of the lower-arm transformer switch SCL of the converter 30, is connected.

Each of the positive and negative power-supply paths L1 and L2 is electrically isolated from a ground portion G1 of the vehicle, such as the body of the vehicle. Resistances, such as parasitic resistances, between the ground portion G1 and the power-supply paths L1 and L2 will be referred to as insulation resistances Rn. In addition, there are noise reduction capacitors and ground capacitances, such as parasitic capacitances, between each of the power-supply paths L1 and L2 and the ground portion G1. The total of the capacitances of the respective noise reduction capacitors and the ground capacitances will be referred to as insulation capacitance Cn.

The rotary electric machine 10 is connected to the power-supply paths L1 and L2, so that there is a parasitic resistance between the rotary electric machine 10 and the ground portion G1. The insulation resistances Rn include the parasitic resistance between the rotary electric machine 10 and the ground portion G1. Similarly, there is a parasitic capacitance between the rotary electric machine 10 and the ground portion G1. The insulation capacitance Cn includes the parasitic capacitance between the rotary electric machine 10 and the ground portion G1.

The insulation resistance determination apparatus 50 is connected to a selected one of the positive and negative power-supply paths L1 and L2, and is configured to detect the insulation resistance Rn between the ground portion G1 and the selected one of the positive and negative power-supply paths L1 and L2.

The following describes the insulation resistance determination apparatus 50.

The insulation resistance determination apparatus 50 includes a circuit module 52, a filter circuit 54, and a controller 56.

The circuit module 52 includes an oscillator 53, a resistor R1, which has a predetermined resistance, and a coupling capacitor C1. The oscillator 53, the resistance R1, and the coupling capacitor C1 are connected in series to each other in this order; the oscillator 53; each of the oscillator 53 and the coupling capacitor C1 has opposing first and second ends. The first end of the oscillator 53 is connected to the first end of the resistor R1, and the second end of the resistor R1 is connected to the first end of the coupling capacitor C1, and the second end of the oscillator 53 is connected to the ground portion G1.

The DC power source 40, converter 30, inverter 20, and rotary electric machine 10 constitute a high-voltage circuit, and the insulation resistance determination apparatus 50 serves as a low-voltage circuit.

The second end of the coupling capacitor C1 is connected to a connection point M1 on the negative power-supply path L2.

The coupling capacitor C1 is configured to pass an input current, which is inputted from one of the high- and low-voltage circuits, therethrough to the other thereof while eliminating a DC component contained in the input current.

Additionally, the coupling capacitor C1 is configured to transmit an input current, which is inputted from one of the high- and low-voltage circuits, therethrough to the other thereof while enabling an alternating current (AC) component contained in the input current to pass therethrough.

The circuit module 52 has a connection point M2 at which the second end of the resistor R1 and the first end of the coupling capacitor C1 are connected.

If the oscillator 53 outputs an AC voltage signal with a predetermined frequency of, for example, approximately 2 Hz via the resistor R1 and the coupling capacitor C1 in the circuit module 52, a detection voltage, i.e., an analog voltage, VD at the connection point M2 finally becomes a value; the value can be obtained by dividing a value of the AC voltage signal outputted from the oscillator 53 by the resistance of the resistor R1 and the insulation resistance Rn connected thereto. The detection voltage VD at the connection point M2 is inputted to the filter circuit 54. The AC voltage signal of the first embodiment corresponds to a frequency signal.

The filter circuit 54 is connected to the connection point M2 between the resistor R1 and the coupling capacitor C1. The filter circuit 54 serves as an analog-to-digital converter (A/D converter) configured to convert the analog detection voltage VD at the connection point M2 upon the oscillator 53 outputting the AC voltage signal to the resistance R1 into a digital detection voltage VD that can be processible by the controller 56.

The controller 56 is configured to detect, i.e., sample, a value of the detection voltage VD, i.e., the digital detection voltage VD, at the connection point M2 through the filter circuit 54 as a sampled value of the detection voltage VD every predetermined processing period, and calculate, every predetermined processing period, a value of a moving average VA based on the sampled values of the detection voltage VD.

The controller 56 is also configured to determine, based on a currently calculated value of the moving average VA, the insulation resistance Rn between the ground portion G1 and the selected one of the positive and negative power-supply paths L1 and L2. The predetermined processing period is set to be identical to the period of the AC voltage signal of, for example, approximately 2 Hz.

The controller 56 is additionally configured to determine whether an insulation fault has occurred for the high-voltage circuit, i.e., a leakage of current has occurred between the high-voltage circuit and the ground portion G1.

The controller 56 is configured to perform, upon determination that a leakage of current has occurred, various tasks that address the leakage of current; the various tasks include a task of outputting warning information. Various functions, which can be offered by the controller 56, can be implemented by, for example, (i) The combination of software stored in a tangible memory device and a computer that executes the software stored in the tangible memory device
    (ii) One or more hardware circuits, or
    (iii) The combination of the computer, which executes software, and the one or more hardware circuits Calculation of a value of the moving average VA for each processing period requires plural sampled values of the detection voltage VD. Using the moving average for detection of a steady-state value of the insulation resistance Rn enables the detected steady-state value of the insulation resistance Rn to have a higher accuracy independently of, for example, noise.

Using the moving average for detection of a steady-state value of the insulation resistance Rn may however result in a longer time that is required for the insulation resistance Rn to reach a steady-state value.

For example, if a leakage of current is detected between the high-voltage circuit and the ground portion G1, the sampled value of the detection voltage immediately after the detection of the leakage of current sharply changes, and thereafter the sampled values of the detection voltage VD converge to a steady-state value.

In contrast, because calculated values of the moving average gradually change after the detection of the leakage of current, a longer time may be required for the calculated values of the moving average to converge to a steady-state value. This may therefore result in a longer time that is required for the insulation resistance Rn to reach a steady-state value, resulting in a delay in determination of whether a leakage of current is detected between the high-voltage circuit and the ground portion G1.

For this reason, users strongly require development of a technology that enables the insulation resistance Rn to converge to a steady state earlier to thereby detect a proper value of the insulation resistance Rn.

From this viewpoint, the insulation resistance determination apparatus 50 according to the first embodiment is configured to (1) Determine whether a currently sampled value of the detection voltage VD has changed by at least a preset value from an immediately previous sampled value of the detection voltage VD
    (2) Determine whether the detection voltage VD becomes stable at around the currently sampled value thereof in response to determination that the currently sampled value of the detection voltage VD has changed by at least the preset value from the immediately previous sampled value of the detection voltage VD
    (3) Perform, based on the currently sampled value of the detection voltage VD instead of a currently calculated value of the moving average VA, an insulation-resistance determination task of determining the insulation resistance Rn in response to determination that the detection voltage VD becomes stable around at the currently sampled value thereof.

This enables the insulation resistance Rn to converge to a steady state earlier as compared with the case of performing an insulation-resistance determination task based on the currently calculated value of the moving average VA.

Figure 2:
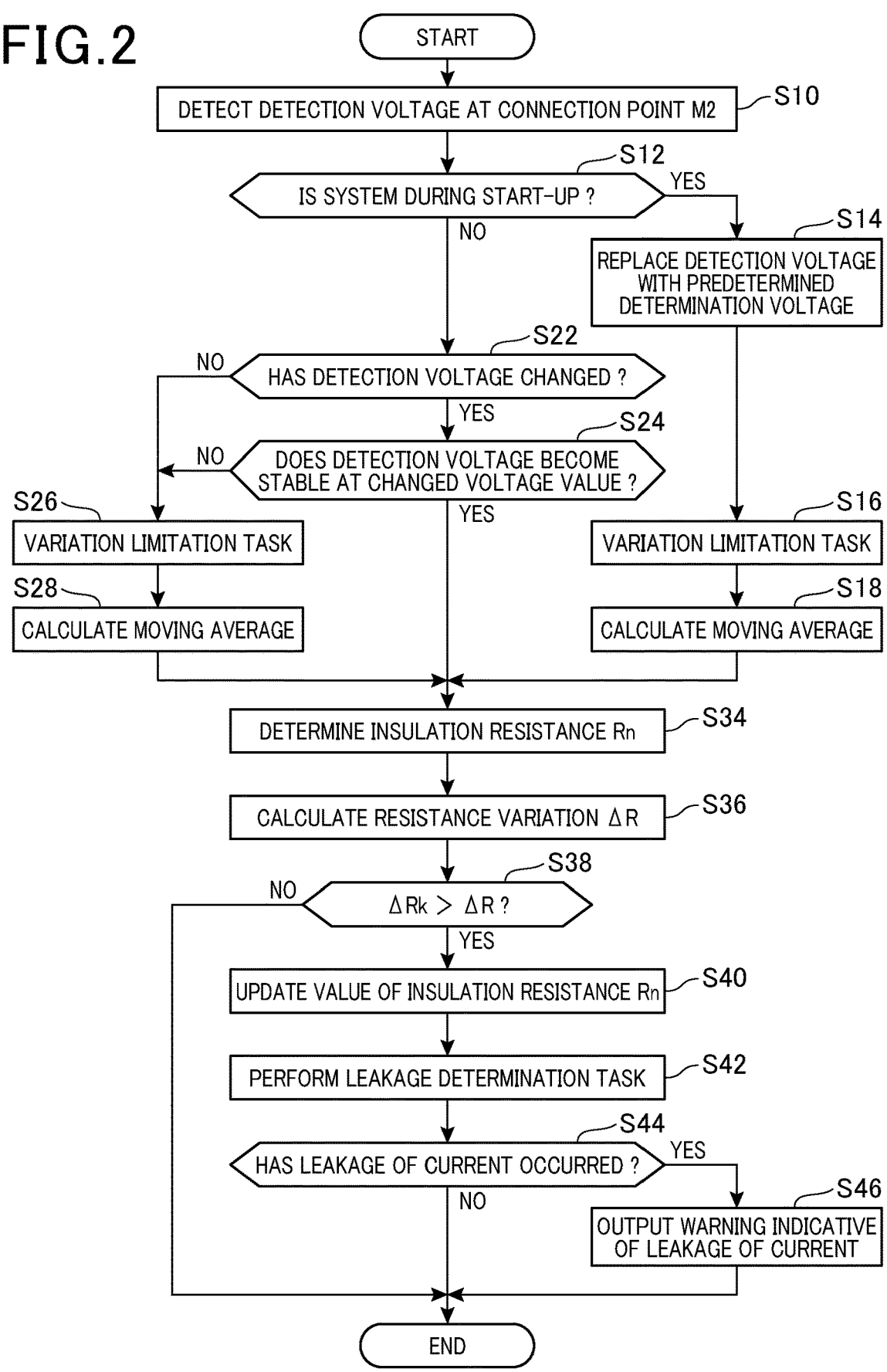
FIG. 2 is a flowchart illustrating an insulation resistance determination routine according to the first embodiment.

FIG. 2 illustrates a flowchart indicative of an insulation resistance determination routine, which will be referred to simply as a determination routine, according to the first embodiment. The controller 56 repeatedly performs, every predetermined processing period, a cycle of the determination routine during an activated state of the vehicle power system 100, i.e., during an on state of an ignition switch provided in the vehicle in which the insulation resistance determination apparatus 50 is installed.

When starting a current cycle of the determination routine, the controller 56 samples a value of the detection voltage VD at the connection point M2 in step S10.

Next, the controller 56 serves as a start-up determiner to determine whether the current cycle of the determination routine, i.e., the current sampling timing of the value of the detection voltage in the current cycle of the determination routine, is during start-up of the vehicle power system 100 in step S12.

Figure 3A:
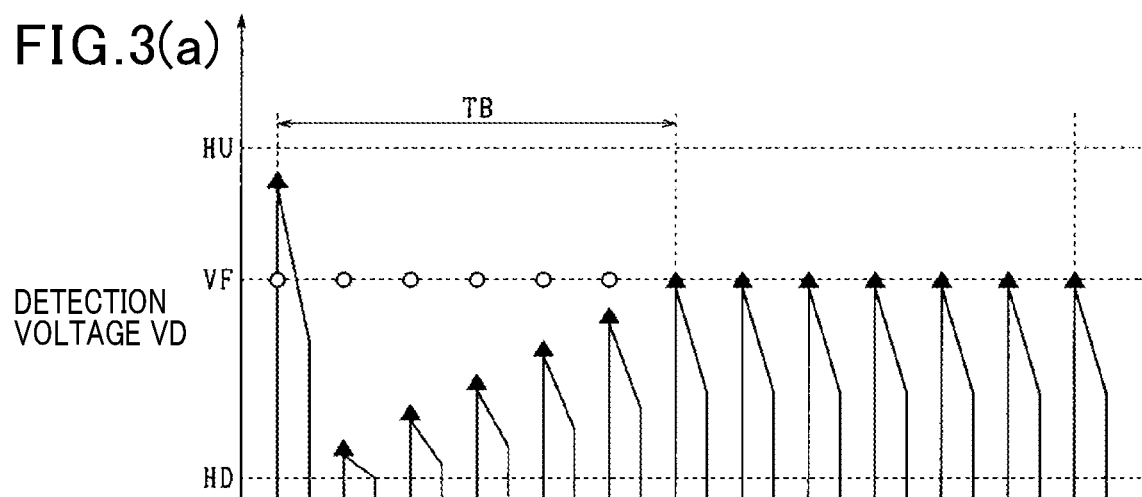
FIGS. 3(a) and 3(b) are a joint timing chart illustrating how sampled values of a detection voltage change and calculated values of a moving average change over time during start-up of the system.

For example, the controller 56 measures an elapsed time that has elapsed since the ignition switch being changed to the on state, and determines whether the elapsed time is shorter than a predetermined reference time period TB (see FIG. 3(a)) in step S12. Then, the controller 56 determines that the current cycle of the determination routine is during the start-up of the vehicle power system 100 in response to determination that the elapsed time is shorter than the predetermined reference time period TB.

The reference time period TB represents a time previously determined based on the power-supply voltage Vbat.

In response to determination that the current cycle of the determination routine is during the start-up of the vehicle power system 100 (YES in step S12), the controller 56 serves as a voltage replacing unit to replace the sampled value of the detection voltage VD sampled in step S10 with a predetermined steady voltage in step S14. The predetermined steady voltage according to the first embodiment is set to an insulation voltage VF at the connection point M2 under a situation where there is no short-circuit between the ground portion G1 and each of the power-supply paths L1 and L2, i.e., there is no leakage of current between the ground portion G1 and each of the power-supply paths L1 and L2. The insulation voltage VF corresponds to a first predetermined voltage.

Following the operation in step S14, the controller 56 performs a variation limitation task in step S16.

Specifically, the variation limitation task is programmed to set an effective variation range for the detection voltage VD so that calculation of the moving average VA for reduction in noise included in sampled values of the detection voltage VD should be carried out based on selected sampled values of the detection voltage VD included within the effective variation range. The variation limitation task according to the first embodiment is programmed to set an upper limit HU and a lower limit HD of the effective variation range in accordance with one or more sampled values of the detection voltage VD that have been sampled until the immediately previous cycle of the determination routine.

Next, the controller 56 calculates a value of the moving average VA in step S18. The value of the moving average VA calculated in step S18 of the current cycle of the determination routine represents an average of sampled values of the detection voltage VD that have been sampled a predetermined calculation time period TA (see FIG. 3(b)) before the current cycle of the determination routine. For this reason, the controller 56 calculates a value of the moving average VA in accordance with only values of the insulation voltage VF in step S18.

For example, the calculation time period TA represents a time equal to the four predetermined processing periods, so that a maximum of five sampled values of the detection voltage VD can be sampled within the calculation time period TA. The calculation time period TA of the first embodiment corresponds to a first time.

Otherwise, in response to determination that the current cycle of the determination routine is not during the start-up of the vehicle power system 100 (NO in step S12), the controller 56 serves as a voltage determiner to determine whether the sampled value of the determination voltage VD sampled in step S10 of the current cycle of the determination routine has changed by at least first preset value Vtg1 since a sampled value of the determination voltage sampled in step S10 of the immediately previous cycle of the determination routine in step S22.

Figure 4A:
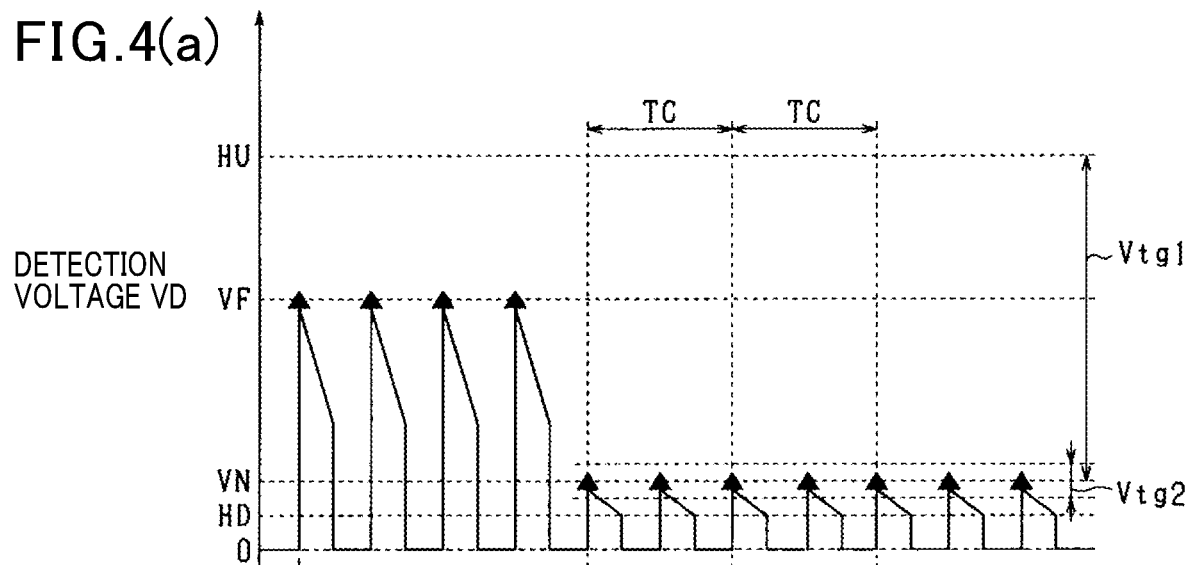
FIGS. 4(a) and 4(b) are a joint timing chart illustrating how sampled values of the detection voltage and calculated values of the moving average change over time after there is a leakage of current.
Figure 4B:
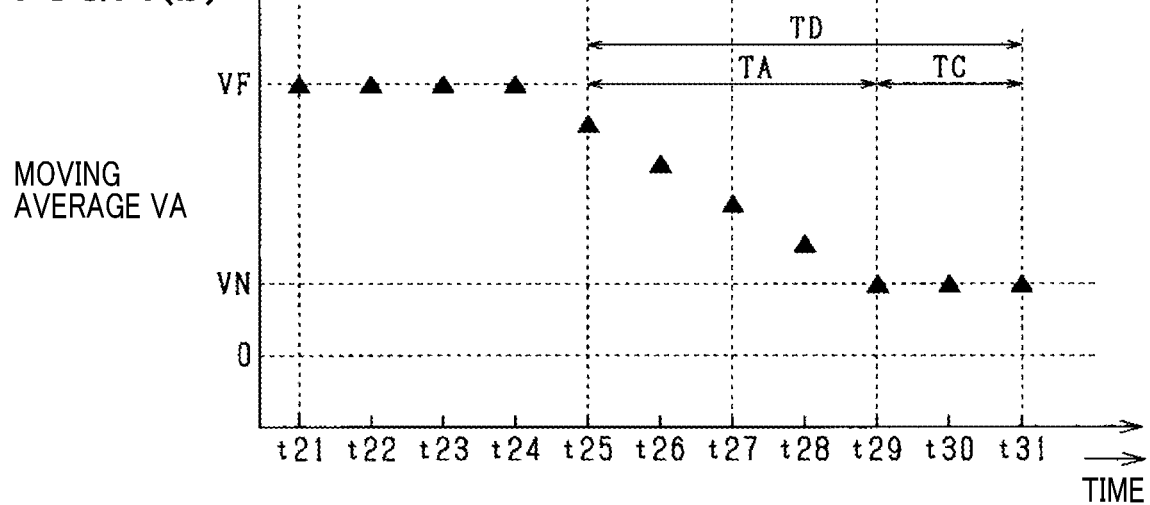

The first preset value Vtg1 corresponds to an absolute difference between the insulation voltage VF and a short-circuit voltage VN (see FIGS. 4(a) and 4(b)). The short-circuit voltage VN represents a voltage at the connection point M2 under a situation where there is a short-circuit between the ground portion G1 and one of the power-supply paths L1 and L2, i.e., there is a leakage of current between the ground portion G1 and each of the power-supply paths L1 and L2. The short-circuit voltage VN corresponds to a second predetermined voltage.

In response to determination that the sampled value of the determination voltage VD sampled in step S10 of the current cycle of the determination routine has changed by at least the first preset value Vtg1 since the sampled value of the determination voltage sampled in step S10 of the immediately previous cycle of the determination routine (YES in step S22), the controller 56 serves as the voltage determiner to perform the following operation in step S24.

Hereinafter, the sampled value of the determination voltage VD sampled in step S10 of the current cycle of the determination routine, which has changed by the at least the first preset value Vtg1 since the sampled value of the determination voltage sampled in step S10 of the immediately previous cycle of the determination routine, will also be referred to as a changed voltage value.

Specifically, the controller 56 determines whether the detection voltage VD becomes stable at around the changed voltage value in step S24.

Specifically, the controller 56 in step S24 is programmed to
(1) Calculate at least one change quantity $\Delta V$ between at least one pair of adjacent sampled values of the detection voltage VD that has been sampled for a predetermined determination time period TC that is shorter than the calculation time period TA (2) Determine whether the at least one change quantity $\Delta V$ has been continuously smaller than a second preset value Vtg2 for the determination time period TC; the second preset value Vtg2 (see FIG. 4(a)) is set to be smaller than the first preset value Vtg1

(3) Determine that the detection voltage VD becomes stable in response to determination that the at least one change quantity $\Delta V$ is smaller than the second preset value Vtg2

For example, the determination time period TC represents a time equal to the two predetermined processing periods, so that two change quantities $\Delta V$ can be calculated for the determination time period TC.

Subsequently, the controller 56 performs the following variation limiting task in step S26 in response to
(1) Determination that the sampled value of the determination voltage VD sampled in step S10 of the current cycle of the determination routine has not changed by at least the first preset value Vtg1 since the sampled value of the determination voltage sampled in step S10 of the immediately previous cycle of the determination routine (NO in step S22) or
(2) Determination that the detection voltage VD does not become stable at around the changed voltage value (NO in step S24)

The variation limiting task in step S26 is identical to that in step S16, so that the duplicated description of which is omitted.

Following the operation in step S26, the controller 56 calculates a value of the moving average VA in step S28. The value of the moving average VA calculated in step S28 of the current cycle of the determination routine is different from that calculated in step S18 of the current cycle of the determination routine in only the following point that sampled values of the detection voltage VD used for calculating the moving average VA in step S28 have been actually sampled in step S10 except for the insulation voltage VF.

Following step S20 or S28 in which the corresponding value of the moving average VA has been calculated, the controller 56 serves as a resistance determiner that determines a value of the insulation resistance Rn as a function of the calculated value of the moving average VA in step S34.

That is, if the current cycle of the determination routine is not during the start-up of the vehicle power system 100, the operation in step S34 determines a value of the insulation resistance Rn as a function of the value of the moving average VA that is calculated based on sampled values of the detection voltage VD.

Otherwise, if the current cycle of the determination routine is during the start-up of the vehicle power system 100, the operation in step S34 determines a value of the insulation resistance Rn as a function of the value of the moving average VA that is calculated based on the insulation voltages VF instead of the sampled values of the detection voltage VD.

More specifically, the controller 56 includes a storage unit 57 (see FIG. 1) in which predetermined conversion information is stored, and converts the calculated value of the moving average VA into a value of the insulation resistance Rn using the conversion information. One or more rewritable non-volatile memories, such as ROMs, constitute the storage unit 57.

Otherwise, upon determination that the detection voltage VD becomes stable at around the changed voltage value (YES in step S24), the controller 56 determines a value of the insulation resistance Rn as a function of the sampled value of the determination voltage VD sampled in step S10 of the current cycle of the determination routine instead of the moving average VA in step S34. In the storage unit 57, additional conversion information that enables the controller 56 to convert the sampled value of the determination voltage VD into a value of the insulation resistance Rn is stored in addition to the conversion information that enables the controller 56 to convert the moving average VA into the insulation resistance Rn.

Following the operation in step S35, the controller 56 calculates a resistance variation ΔR among the values of the insulation resistance Rn that has been calculated for the determination time period TC in step S36. Next, the controller 56 determines whether the calculated resistance variation ΔR of the values of the insulation resistance Rn is smaller than a predetermined reference variation ΔRk in step S38. The reference variation ΔRk represents a converged variation within which the insulation resistance Rb sufficiently converges to a steady state.

Upon determination that the calculated resistance variation ΔR of the values of the insulation resistance Rn is larger than or equal to the reference variation ΔRk (NO in step S38), the controller 56 terminates the current cycle of the determination routine. Otherwise, upon determination that the calculated resistance variation ΔR of the values of the insulation resistance Rn is smaller than the reference variation ΔRk (YES in step S38), the controller 56 updates a previously stored value of the insulation resistance Rn in the storage unit 57 into the value of the insulation resistance Rn calculated in step S34 of the current cycle of the determination routine in step S40.

Following the operation in step S40, the controller 56 performs a leakage determination task based on the value of the insulation resistance Rn updated in step S40 in step S42 to accordingly determine whether a leakage of current has occurred between the high-voltage circuit and the ground portion G1 in step S44.

For example, the leakage determination task is programmed to determine whether the value of the insulation resistance Rn updated in step S40 is lower than or equal to a predetermined reference value, and determine that a leakage of current has occurred between the high-voltage circuit and the ground portion G1 (YES in step S44) upon determination that the value of the insulation resistance Rn updated in step S40 is lower than or equal to the predetermined reference value.

As another example, the leakage determination task is programmed to determine whether a leakage of current has occurred between the high-voltage circuit and the ground portion G1 in accordance with a ratio of one of the value of the insulation resistance Rn updated in step S40 and the power-supply voltage Vbat to the other thereof in steps S42 and S44.

Upon determination that a leakage of current has not occurred (NO in step S44), the controller 56 terminates the current cycle of the determination routine. Otherwise, upon determination that a leakage of current has occurred (YES in step S44), the controller 56 performs the task of outputting warning information indicative of the occurrence of a leakage of current in step S46, and thereafter terminates the current cycle of the determination routine.

In step S46, the controller 56 can be programmed to interrupt the power supply from the DC power source 40 and/or the charging of the DC power source 40 while outputting the warning information. Specifically, the controller 56 can be programmed to output drive signals to the respective upper- and lower-arm transformer switches SCH and SCL to thereby interrupt power conduction between the high-voltage circuit and the DC power source 40.

Each of FIGS. 3 and 4 illustrates a corresponding example that how the determination routine is carried out.

Figure 3B:
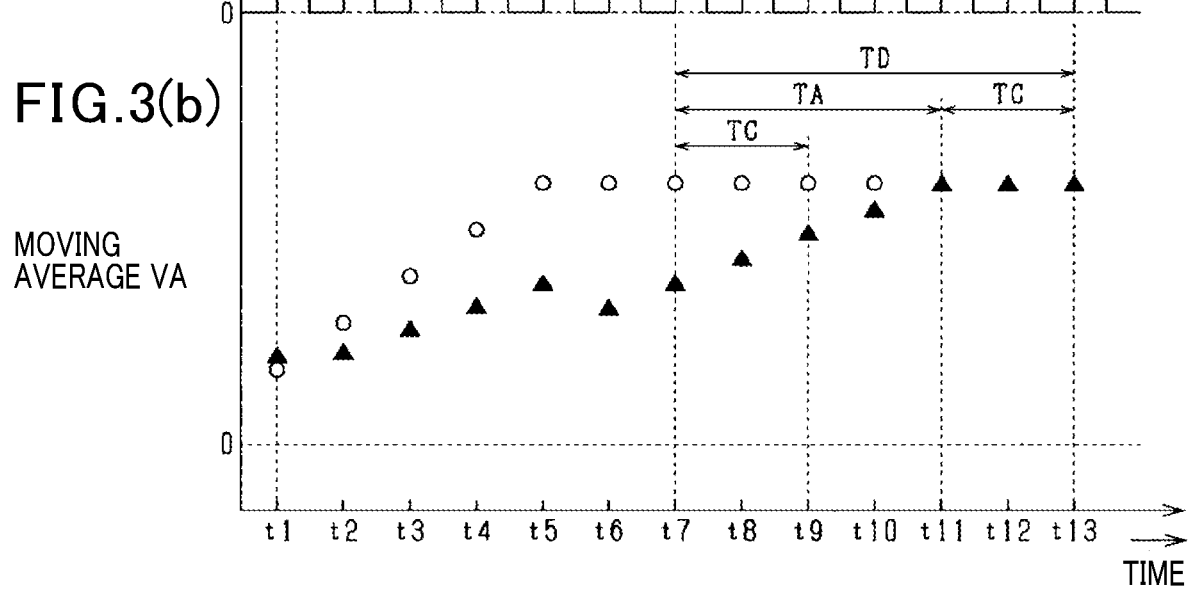

Specifically, FIG. 3(a) illustrates how sampled values of the detection voltage VD change over time during and after the start-up of the vehicle power system 100, and FIG. 3(b) illustrates how the calculated values of the moving average VA change over time during and after the start-up of the vehicle power system 100.

Additionally, FIG. 4(a) illustrates how sampled values of the detection voltage VD change over time during which there is a leakage of current between the high-voltage circuit and the ground portion G1. FIG. 4(b) illustrates how the calculated values of the moving average VA change over time during which the leakage of current has occurred between the high-voltage circuit and the ground portion G1.

In FIGS. 3(a) and 3(b), sampled values of the detection voltage VD and a first set of values of the moving average VA calculated based on only the values of the detection voltage VD are illustrated with triangular marks. Additionally, in FIGS. 3(a) and 3(b), insulation voltages VF and a second set of values of the moving average VA calculated based on the insulation voltages VF are illustrated with circular marks.

FIGS. 3(a) and 3(b) show that change of the power-supply voltage Vbat resulting from change of currents flowing through the converter and/or the inverter 20 during the start-up of the vehicle power system 100 causes the detection voltage VD to change during the reference time period TB. This causes the first set of values of the moving average VA to be unstable during the reference time period TB, and, when the calculation time period TA has elapsed after lapse of the reference time period TB, the first set of values of the moving average VA to become stable. This results in values of the insulation resistance Rn determined based on the first set of values of the moving average VA being determined to converge to a steady state when the determination time period TC has elapsed after lapse of the calculation time period TA.

That is, determination of the insulation resistance Rn based on the first set of values of the moving average VA takes a first summation time period TD, which is the sum of the reference time period TB, the calculation time period TA, and the determination time period TC; the first summation time period TD is required for the insulation resistance Rn to have converged to a steady state. This therefore results in a longer time until the insulation resistance Rn converges to a steady state.

In contrast, the first embodiment replaces the sampled values of the detection voltage VD with insulation voltages VF during the reference time period TB, i.e., during the start-up of the vehicle power system 100, and therefore calculates the second set of values of the moving average VA based on the insulation voltages VF. This therefore enables the second set of values of the moving average VA to become stable immediately after the lapse of the reference time period TB upon determination that no current leakage has occurred. This results in values of the insulation resistance Rn being determined to converge to a steady state when the determination time period TC has elapsed after lapse of the reference time period TB. This therefore makes it earlier for the insulation resistance Rn to converge to a steady state during or after the start-up of the vehicle power system 100.

FIG. 4(a) shows that, upon determination that a leakage of current has occurred, the detection voltage VD, which has changed from a value of the insulation voltage VF to a value of the short-circuit voltage VN, becomes stable at around the changed value of the short-circuit voltage VN.

FIG. 4(b) shows that the first set of values of the moving average VA becomes stable when the calculation time period TA has elapsed since determination that a leakage of current has occurred. This results in the insulation resistance Rn determined based on the first set of values of the moving average VA being determined to become stable when the determination time period TC has elapsed after lapse of the calculation time period TA. This takes, upon determination that a leakage of current has occurred, a second summation time period TD, which is the sum of the calculation time period TA and the determination time period TC; the second summation time period TD is required for the insulation resistance Rn to have converged to a steady state. This therefore results in a longer time until the insulation resistance Rn converges to a steady state.

In contrast, the first embodiment determines a value of the insulation resistance Rn based on a value of the detection voltage VD sampled for each cycle of the determination routine instead of the first set of value of the moving average VA upon determination that the detection voltage VD, which has changed by at least the first preset value Vtg1, becomes stable at around a changed value of the detection voltage VD. The first embodiment determines that the insulation resistance Rn after determination that a leakage of current has occurred becomes stable when the determination time period TC has elapsed after start of calculating a value of the insulation resistance Rn based on a sampled value of the detection voltage VD. In other words, the first embodiment determines that the insulation resistance Rn after determination that a leakage of current has occurred becomes stable when a doubling of the determination time period TC has elapsed since determination that a leakage of current has occurred. This therefore makes it earlier for the insulation resistance Rn to converge to a steady state even if there is a leakage of current between the high-voltage circuit and the ground portion G1.

The first embodiment described above offers the following benefits.

The first embodiment determines a value of the insulation resistance Rn based on a calculated value of the moving average VA accurately with little influence of, for example, noise.

The occurrence of a short-circuit between the ground portion G1 and one of the power supply paths L1 and L2, i.e., the occurrence of a leakage of current therebetween, causes the detection voltage VD to change by at least the first preset voltage Vtg1, and thereafter the detection voltage VD becomes stable at around a changed value. In response to this change, the first embodiment is configured to determine a value of the insulation resistance Rn based on a currently sampled value of the detection voltage VD instead of the moving average VA. This configuration enables the insulation resistance Rn to converge to a steady state earlier even if a leakage of current has occurred, making it possible to properly determine the insulation resistance Rn.

The determination time period TC according to the first embodiment, which is used to determine whether the detection voltage VD is stable, is set to be shorter than the calculation time period TA used to calculate the moving average VA. Even if the first embodiment determines the insulation resistance Rn after determination that the detection voltage Vn is stable, the first embodiment makes determination of the insulation resistance RN earlier as compared with a case of determining the insulation resistance Rn based on the moving average VA.

In particular, the first embodiment is configured to
1. Calculate at least one changed quantity ΔV between at least one pair of adjacent sampled values of the detection voltage VD that has been sampled for the determination time period TC after determination that the detection voltage VD has changed by at least the first preset voltage Vtg1
2. Determine whether the at least one changed quantity ΔV is smaller than the second preset value Vtg2
3. Determine that the detection voltage VD becomes stable in response to determination that the at least one change quantity ΔV is smaller than the second preset value Vtg2

This configuration enables easy and accurate determination of whether the detection voltage VD is stable.

Change of the detection voltage VD has also occurred due to the start-up of the vehicle power system 100 in addition to the occurrence of a leakage of current.

From this viewpoint, the first embodiment is configured to calculate a value of the insulation resistance Rn based on constant values of the predetermined steady voltage instead of sampled values of the detection voltage VD during the start-up of the vehicle power system 100. This configuration therefore enables the insulation resistance Rn to converge to a stable state earlier during the start-up of the vehicle power system 100, making it possible to properly determine the insulation resistance Rn.

Specifically, the first embodiment is configured to replace each sampled value of the detection voltage VD with the constant value of the predetermined steady voltage during the start-up of the vehicle power system 100, and thereafter calculate a value of the moving average VA based on the constant values of the predetermined steady voltage. Then, the first embodiment is configured to determine, based on the calculated value of the moving average VA, the insulation resistance Rn. This configuration makes the moving average VA stable earlier. This therefore enables the insulation resistance Rn calculated based on the moving average VA to converge to a stable state earlier during the start-up of the vehicle power system 100.

In particular, the first embodiment is configured such that the insulation voltage VF is set to the predetermined voltage. This configuration makes the moving average VA stable earlier if no short-circuit occurs between the ground portion G1 and each of the power-supply paths L1 and L2.

Second Embodiment

The following describes the second embodiment with reference to FIGS. 5 and 6. In particular, the following describes mainly the different points of the second embodiment from the first embodiment.

The second embodiment is configured such that plural types of predetermined steady voltages are stored in the storage unit 57, which is different from the first embodiment.

Specifically, as the plural types of predetermined steady voltages, the insulation voltage VF, the short-circuit voltage VN, and a median voltage VM between the insulation voltage VF and the short-circuit voltage VN.

FIG. 5 illustrates a flowchart indicative of an insulation resistance determination routine, which will be referred to simply as a determination routine, according to the second embodiment.

In response to determination that the current cycle of the determination routine is during the start-up of the vehicle power system 100 (YES in step S12), the controller 56 performs a selection subroutine to thereby select any one of the predetermined steady voltages stored in the storage unit 57 in step S50. Then, the controller 56 performs the operation in step S14 using the selected predetermined steady voltage.

Figure 6A:
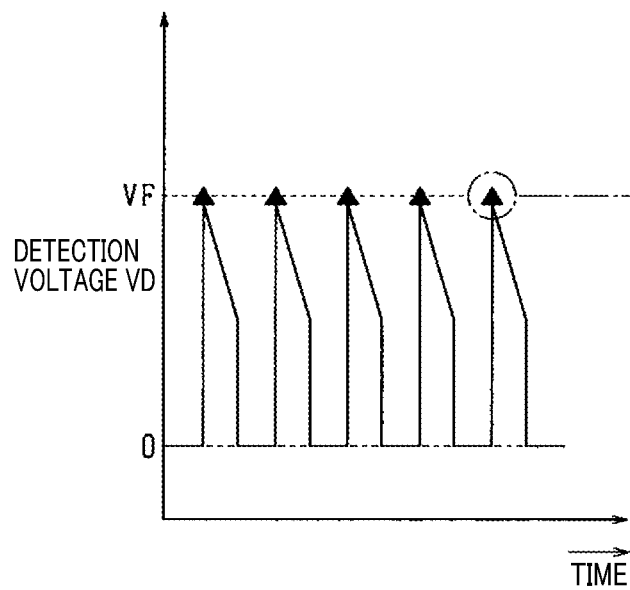
FIG. 6(a) is a timing chart illustrating how a first change pattern of sampled values of the detection voltage over time according to the second embodiment.
Figure 6B:
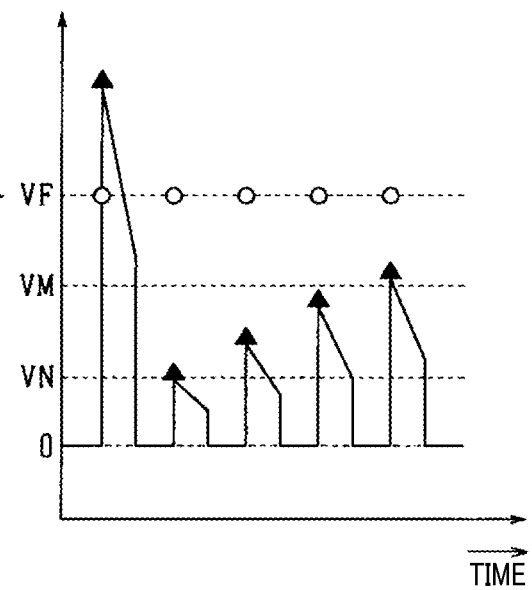
FIG. 6(b) is a timing chart illustrating a second change pattern of sampled values of the detection voltage over time according to the second embodiment.

FIGS. 6(a) and 6(b) show an example of how the selection subroutine is carried out. Specifically, FIG. 6(b) illustrates how sampled values of the detection voltage VD change over time during a current activated state of the vehicle power system 100, and FIG. 6(a) illustrates how sampled values of the detection voltage VD change over time during an immediately pervious activated state of the vehicle power system 100.

FIG. 6(a) shows that there is no leakage of current between the ground portion G1 and each of the power-supply paths L1 and L2, so that constant values of the insulation voltage VF are detected as the detection voltage VD during the immediately pervious activated state of the vehicle power system 100. This results in a last updated value of the insulation resistance Rn at the termination of the immediately pervious activated state of the vehicle power system 100, which are based on the constant values of the insulation voltage VF, being stored in the storage unit 57.

During the current start-up of the vehicle power system 100 after the termination of the immediately pervious activated state of the vehicle power system 100, it is therefore expected that the constant values of the insulation voltage VF are used instead of the sampled values of the detection voltage VD after the power-supply voltage Vbat is stable.

If the sampled values of the detection voltage VD are replaced with the constant values of the short-circuit voltage VN or the median voltage VM during the reference time period TB corresponding to the start-up of the vehicle power system 100, a voltage difference between the insulation voltage VF and the short-circuit voltage VN or the median voltage VM may result in a longer time required for the moving average VA to become stable, resulting in a longer time required for the insulation resistance Rn to converge to a steady state.

From this viewpoint, the controller 56 of the second embodiment is configured to perform the selection subroutine to select any one of the predetermined steady voltages in accordance with at least one updated value of the insulation resistance Rn during the immediately previous activated state of the vehicle power system 100.

Specifically, the controller 56, as illustrated in FIG. 6(b), selects, among the insulation voltage VF, short-circuit voltage VN, and median voltage VM, the insulation voltage VF that is the closest to a value of the detection voltage VB corresponding to the last updated value of the insulation resistance Rn at the termination of the of the immediately pervious activated state of the vehicle power system 100. Then, the controller 56 determines a value of the insulation resistance Rn as a function of the selected insulation voltage VF.

This therefore reduces the voltage difference between the detection voltage or a selected steady voltage during the immediately pervious activated state of the vehicle power system 100 and a newly selected steady voltage during the start-up of the vehicle power system 100, resulting in a shorter time required for the moving average VA to become stable. This therefore enables the insulation resistance Rn to converge to a steady state earlier.

The second embodiment as set forth above is configured to select any one of the predetermined steady voltages in accordance with at least one updated value of the insulation resistance Rn during the immediately previous activated state of the vehicle power system 100. This configuration enables the insulation resistance Rn to converge to a steady state earlier.

Third Embodiment

Figure 7:
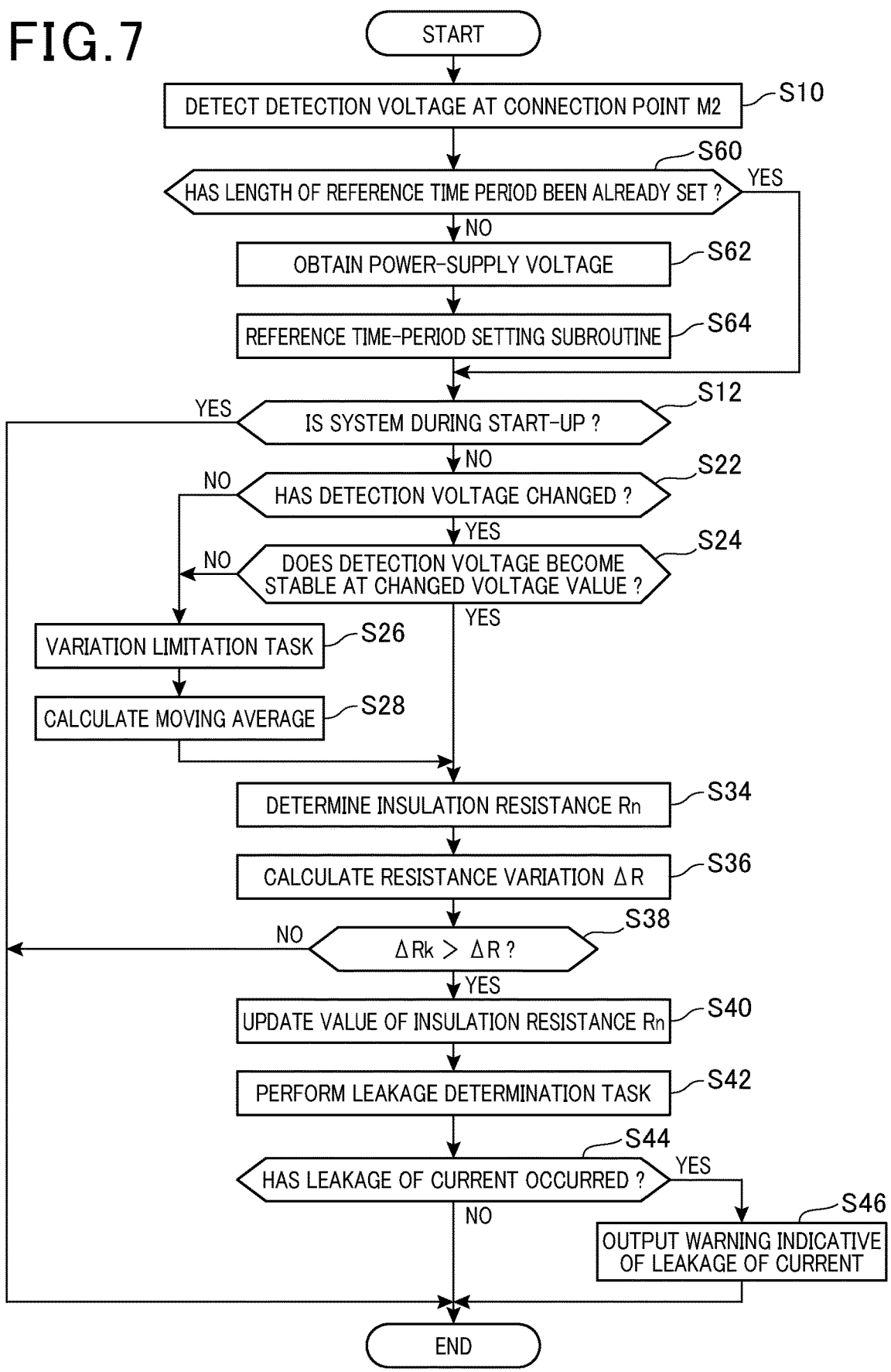
FIG. 7 is a flowchart illustrating an insulation resistance determination routine according to the third embodiment.

The following describes the third embodiment with reference to FIGS. 7 and 8. In particular, the following describes mainly the different points of the third embodiment from the first embodiment.

The third embodiment is configured to prevent determination of a value of the insulation resistance Rn upon determination that the current cycle of the determination routine is during start-up of the vehicle power system 100, which is different from the first embodiment.

The third embodiment is additionally configured to variably set the length of the reference time period TB used for determining whether the current cycle of the determination routine is during start-up of the vehicle power system 100, which is different from the first embodiment.

FIG. 7 illustrates a flowchart indicative of an insulation resistance determination routine, which will be referred to simply as a determination routine, according to the third embodiment.

As illustrated in FIG. 7, when sampling a value of the detection voltage VD at the connection point M2 in step S10, the controller 56 determines whether a value of the length of the reference time period TB has been already set in step S60.

Upon determination that the value of the length of the reference time period TB has been already set (YES in step S60), the determination routine proceeds to step S12.

Otherwise, upon determination that the value of the length of the reference time period TB has not been set yet (NO in step S60), the determination routine proceeds to step S62.

In step S62, the controller 56 serves as a voltage obtainer to obtain the power-supply voltage Vbat. Next, the controller 56 performs a reference time-period setting subroutine to thereby set the length of the reference time period TB as a function of the power-supply voltage Vbat in step S64. After completion of the reference time-period setting subroutine, the determination routine proceeds to step S12.

The reference time-period setting subroutine is programmed to be carried out during the start-up of the vehicle power system 100 in the activated state of the vehicle power system 100. This therefore determines the length of the reference time period TB in accordance with the power-supply voltage Vbat during the start-up of the vehicle power system 100.

In step S12, the controller 56 determines, based on the determined length of the e reference time period TB, whether the current cycle of the determination routine is during start-up of the vehicle power system 100. Then, the controller 56 terminates the determination routine without determining whether there is a leakage of current between the ground portion G1 and each of the power-supply paths L1 and L2 in response to determination that the current cycle of the determination routine is during start-up of the vehicle power system 100 (YES in step S12). That is, the reference time period according to the third embodiment functions as a prevention time period during which determination of whether there is a leakage of current between the ground portion G1 and each of the power-supply paths L1 and L2 is prevented.

Figure 8A:
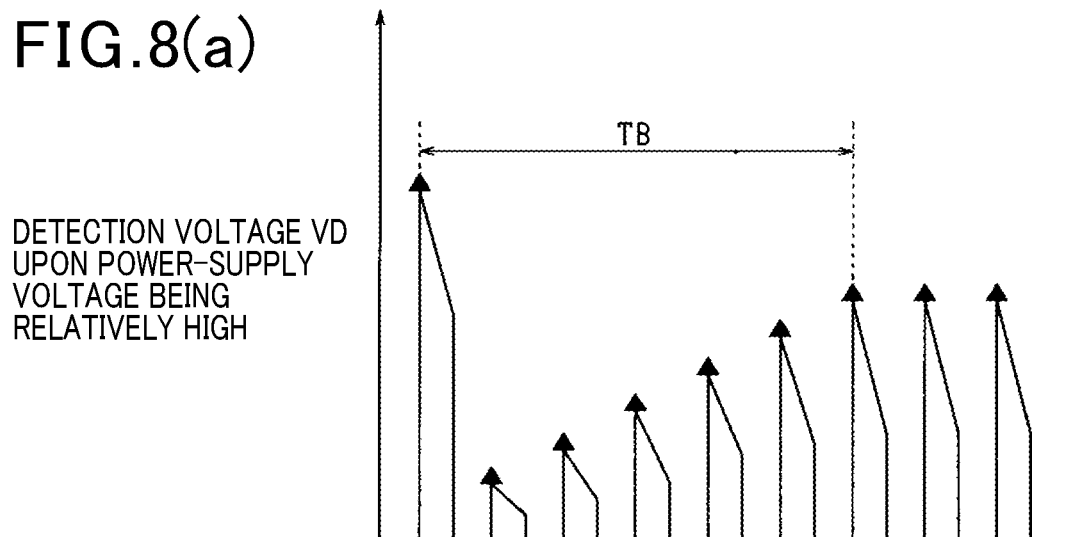
FIGS. 8(a) and 8(b) are a joint timing chart illustrating a first change pattern of sampled voltages over time and a second change pattern of sampled values of the detection voltage over time according to the third embodiment.
Figure 8B:
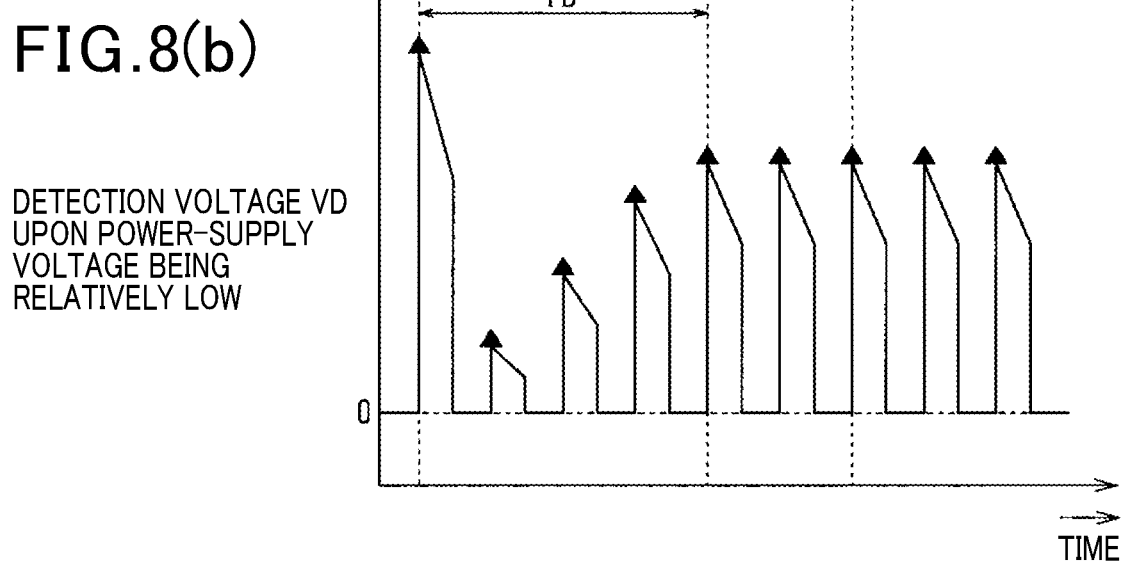

FIG. 8(a) illustrates how sampled values of the detection voltage VD change over time upon the power-supply voltage Vbat is relatively high, and FIG. 8(b) illustrates how sampled values of the detection voltage VD change over time upon the power-supply voltage Vbat is relatively low.

As illustrated in FIGS. 8(a) and 8(b), the higher the power-supply voltage Vbat, the longer a time period for which the detection voltage VD fluctuates during the start-up of the vehicle power system 100. For this reason, the detection voltage VD may change, with the power-supply voltage Vbat being relatively high, over the reference time period TB that is set to a constant length independently of the power supply voltage Vbat. This may result in erroneous determination of the insulating resistance Rn due to change of the detection voltage VD.

As described above, the controller 56 of the third embodiment is configured to perform the reference time-period setting subroutine to thereby set the length of the reference time period TB as a function of the power-supply voltage Vbat. Specifically, the reference time-period setting subroutine increases the length of the reference time period TB as the power-supply voltage Vbat becomes high. This configuration therefore reduces the risk of the detection voltage VD changing over the reference time period TB, thus reducing the risk of erroneous determination of the insulating resistance Rn due to change of the detection voltage VD.

As described above, the third embodiment is configured to prevent determination of whether there is a leakage of current between the ground portion G1 and each of the power-supply paths L1 and L2 during the start-up of the vehicle power system 100, thus reducing the risk of erroneous determination of the insulating resistance Rn due to change of the detection voltage VD.

The length of a time period required for the detection voltage VD to become stable becomes longer as the power-supply voltage Vbat becomes higher during the start-up of the vehicle power system 100. From this viewpoint, the third embodiment is configured to determine the length of the reference time period TB in accordance with the power-supply voltage Vbat, making it possible to reliably reduce the risk of erroneous determination of the insulating resistance Rn due to change of the detection voltage VD.

Modifications

Each of the first to third embodiments can be modified as follows.

The insulation resistance determination apparatus 50 according to each of the first to third embodiments is connected to the negative power-supply path L2, but can be connected to the positive power-supply path L1.

Each of the first to third embodiments can use a sinusoidal AC voltage signal or a square-wave AC voltage signal as the frequency signal.

Each of the first to third embodiments is configured to determine a value of the insulation resistance Rn as a function of the sampled value of the determination voltage VD sampled in step S10 of the current cycle of the determination routine in response to determination that the detection voltage VD becomes stable at around the changed voltage value, but the present disclosure is not limited thereto.

Specifically, a modification of each of the first to third embodiments can be configured to determine a value of the insulation resistance Rn as a function of an average value of sampled values of the determination voltage VD sampled in step S10 of successive cycles during the determination time period TC.

Each of the first to third embodiments uses, as a determination condition of whether the detection voltage VD becomes stable at around the changed voltage value, a condition of whether the at least one change quantity ΔV is smaller than the second preset value Vtg2. The present disclosure is however not limited to this condition.

Figure 9A:
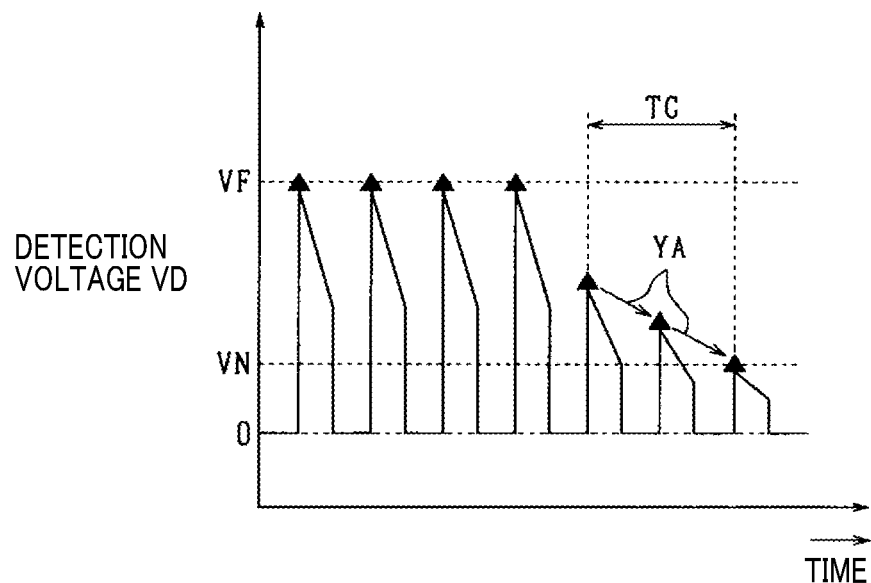
FIG. 9(a) is a timing chart illustrating how sampled values of the detection voltage change over time according to a first modified embodiment.

For example, as illustrated by arrow YA in FIG. 9(a), a first modified embodiment of each of the first to third embodiments can use, as the determination condition of whether the detection voltage VD becomes stable at around the changed voltage value, a first condition of whether sampled values of the detection voltage VD have continuously decreased for the determination time period TC. Similarly, each of the first to third embodiments can use, as the determination condition of whether the detection voltage VD becomes stable at around the changed voltage value, a second condition of whether sampled values of the detection voltage VD have continuously increased for the determination time period TC.

For the first or second condition, because the sampled values of the detection voltage VD have continuously decreased or increased for the determination time period TC without the detection voltage VD alternately increasing and decreasing, it is possible to determine that the detection voltage VD is stable.

Figure 9B:
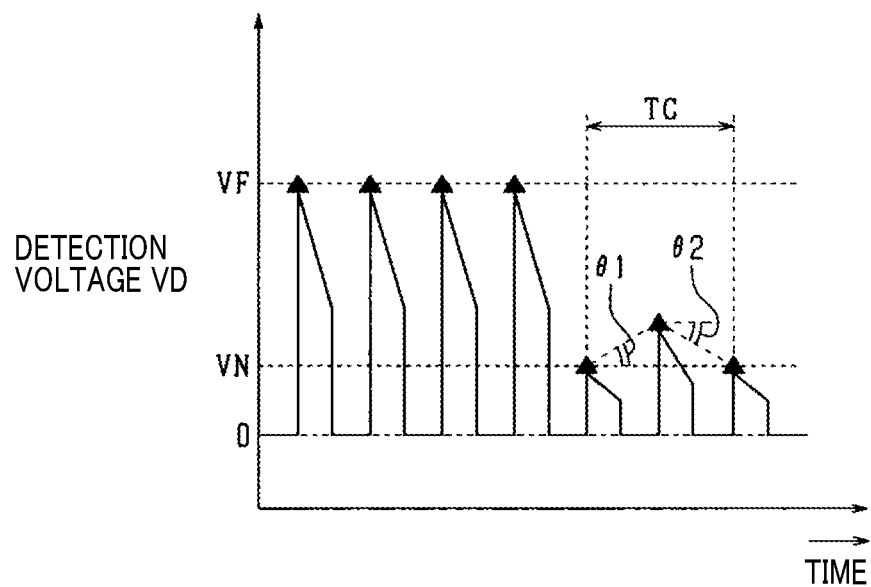
FIG. 9(b) is a joint timing chart illustrating how sampled values of the detection voltage change over time according to a second modified embodiment.

As another example, as illustrated in FIG. 9(b), a second modified embodiment of each of the first to third embodiments can use, as the determination condition of whether the detection voltage VD becomes stable at around the changed voltage value, a condition of whether an absolute gradient (see 01 or 02 in FIG. 9(b)) of successive sampled values of the detection voltage VD is smaller than a threshold gradient for the determination time period TC. This enables whether the detection voltage VD is stable to be simply determined.

The prevention period and the reference time period TB used to determine whether the current cycle of the determination routine is during the start-up of the vehicle power system 100 are identical to each other in each embodiment, but can be different from each other.

Each embodiment uses, as a system start-up determination condition of whether the current cycle of the determination routine is during the start-up of the vehicle power system 100, the condition of determining whether the elapsed time that has elapsed since the ignition switch being changed to the on state is shorter than the reference time period TB, but the present disclosure is not limited thereto. Specifically, each embodiment can use, as the system start-up determination condition, a condition of whether an absolute change amount of the detection voltage VD is within a predetermined range.

Each embodiment is configured to perform an insulation resistance determination task of (i) periodically calculating a value of the moving average VA based on sampled values of the predetermined determination voltage, and (ii) determining, based on the value of the moving average VA, a value of the insulation resistance R, but the present disclosure is not limited thereto.

Specifically, each embodiment can perform, as the insulation resistance determination task, a task of directly determining a value of the insulation resistance Rn in accordance with the sampled values of the predetermined determination voltage without calculating the moving average VA.

Each embodiment shows an example that the insulation voltage VF is used as the predetermined determination voltage, but the short-circuit voltage VN or median voltage VM can be used as the predetermined determination voltage. For example, when using the short-circuit voltage VN as the predetermined determination voltage, even if there is a leakage of current between the ground portion G1 and one of the power-supply path L1 or L2, each embodiment can make the moving average VA stable earlier.

An intermediate voltage between the insulation voltage VF and the short-circuit voltage VN can be used as the predetermined determination voltage. The intermediate voltage means any one of values, such as the median voltage VM, between the insulation voltage VF and the short-circuit voltage VN. This can make the moving average VA stable earlier in both cases where (1) There is a leakage of current between the ground portion G1 and one of the power-supply path L1 or L2
(2) There are no leakages of current between the ground portion G1 and each of the power-supply paths L1 and L2

The length of each time period described in each embodiment shows an example, and therefore a freely selected length can be used as the length of each time period.

Each embodiment focuses on, as a case of at least certain level of change in the detection voltage VD, (i) a case of the vehicle power system 100 being during start-up, and (ii) a case of the occurrence of a leakage of current between the ground portion G1 and at least one of the power-supply path L1 or L2, but the present disclosure is not limited thereto. Specifically, each embodiment can focus on a case where a leakage of current between the ground portion G1 and at least one of the power-supply path L1 or L2, has occurred, which is resolved as in the case of the at least certain level of change in the detection voltage VD.

The controllers and methods described in the present disclosure can be implemented by a computer including a memory and a processor programmed to perform one or more functions embodied by one or more computer programs.

The controllers and methods described in the present disclosure can also be implemented by a dedicated computer including a processor comprised of one or more dedicated hardware logic circuits.

The controllers and methods described in the present disclosure can further be implemented by a processor system comprised of a memory, a processor programmed to perform one or more functions embodied by one or more computer programs, and one or more hardware logic circuits.

The one or more programs can be stored in a non-transitory storage medium as instructions to be carried out by a computer or a processor.

The present disclosure of the specification is not limited to the disclosed embodiments. The present disclosure of the specification can include not only the disclosed embodiments but also various modifications within the scope of the present disclosure. The present disclosure of the specification is not limited to combinations of the components and/or elements disclosed in the disclosed embodiments, and therefore can be implemented by various combinations within the scope of the present disclosure.

What is claimed is:

1. An insulation resistance detection apparatus applicable to a power system,
the power system including:
(i) a direct-current power source;
(ii) a coupling capacitor having a first end and a second end, the first end of the coupling capacitor being connected to a power-supply path that is connected to the direct-current power source and is electrically isolated from a ground portion;
(iii) a resistor connected to the second end of the coupling capacitor at a connection point therebetween; and
(iv) an oscillator connected to the resistor and configured to output a predetermined frequency signal to the resistor,
the insulation resistance detection apparatus being configured to:
sample, every predetermined period, a value of a detection voltage at the connection point between the resistor and the coupling capacitor;
determine an insulation resistance between the ground portion and the power-supply path based on a moving average of the detection voltage; and
determine whether the determined insulation resistance is lower than or equal to a predetermined reference value to thereby determine whether there is a leakage of current between the ground portion and the power-supply path, and
the insulation resistance detection apparatus comprising:
a voltage determiner configured to determine whether the detection voltage, which has changed by at least a preset value, becomes stable at a changed voltage value; and
a resistance determiner configured to determine a value of the insulation resistance between the ground portion and the power-supply path based on a currently sampled value of the detection voltage instead of the moving average in response to determination that the detection voltage, which has changed by at least the preset value, becomes stable at the changed voltage value.

2. The insulation resistance detection apparatus according to claim 1, wherein:
the insulation resistance detection apparatus is configured to calculate the moving average based on sampled values of the detection voltage sampled for a first time period; and
the voltage determiner is configured to determine whether the detection voltage becomes continuously stable at the changed voltage value for a second time period that is shorter than the first time period.

3. The insulation resistance detection apparatus according to claim 2, wherein:
the preset value is a first preset value; and
the voltage determiner is configured to:
calculate, after the detection voltage has changed by at least the first preset value, a change quantity between at least one pair of adjacent sampled values of the detection voltage that has been sampled for the second time period;
determine whether the change quantity has been continuously smaller than a second preset value for the determination time period, the second preset value being smaller than the first preset value; and
determine that the detection voltage becomes stable in response to determination that the change quantity is smaller than the second preset value.

4. The insulation resistance detection apparatus according to claim 2, wherein:
the voltage determiner is configured to:
determine whether the detection voltage has continuously increased or decreased for the second time period; and determine that the detection voltage becomes stable in response to determination that the detection voltage has continuously increased or decreased for the second time period.

5. The insulation resistance detection apparatus according to claim 2, wherein:
the voltage determiner is configured to:
determine whether an absolute gradient of successive sampled values of the detection voltage is smaller than a threshold gradient; and
determine that the detection voltage becomes stable in response to determination that the absolute gradient of the successive sampled values of the detection voltage is smaller than the threshold gradient.

6. The insulation resistance detection apparatus according to claim 2, further comprising:
a start-up determiner configured to determine whether a current sampling timing of the value of the detection voltage is during start-up of the power supply system, wherein:
the resistance determiner is configured to determine a value of the insulation resistance between the ground portion and the power-supply path based on at least one predetermined determination voltage instead of the moving average in response to determination that the current sampling timing of the value of the detection voltage is during start-up of the power supply system.

7. The insulation resistance detection apparatus according to claim 6, further comprising:
a voltage replacing unit configured to replace the detection voltage with the at least one predetermined determination voltage in response to determination that the current sampling timing of the value of the detection voltage is during start-up of the power supply system, wherein:
the resistance determiner is configured to:
calculate a value of the moving average based on values of the at least one predetermined determination voltage; and
determine a value of the insulation resistance between the ground portion and the power-supply path based on the calculated value of the moving average.

8. The insulation resistance detection apparatus according to claim 6, wherein:
the at least one predetermined determination voltage includes a first predetermined determination voltage at the connection point under a situation where there is no short-circuit between the ground portion and the power-supply path.

9. The insulation resistance detection apparatus according to claim 6, wherein:
the at least one predetermined determination voltage includes a second predetermined determination voltage at the connection point under a situation where there is a short-circuit between the ground portion and the power-supply path.

10. The insulation resistance detection apparatus according to claim 6, wherein:
the at least one predetermined determination voltage includes an intermediate value between a first predetermined determination voltage and a second predetermined determination voltage, the first predetermined determination voltage being a voltage at the connection point under a situation where there is no short-circuit between the ground portion and the power-supply path, the second predetermined determination voltage being a voltage at the connection point under a situation where there is a short-circuit between the ground portion and the power-supply path.

11. The insulation resistance detection apparatus according to claim 6, wherein:
the at least one predetermined determination voltage includes at least a first type determination voltage and a second type determination voltage;
the insulation resistance detection apparatus further comprises
a storage unit that stores the first type determination voltage and the second type determination voltage; and
the resistance determiner is configured to:
select, in a current activated state of the power system, one of the first type determination voltage and the second type determination voltage based on at least one value of the insulation resistance determined thereby in an immediately previous activated state of the power system; and
determine a value of the insulation resistance between the ground portion and the power-supply path based on the selected one of the first type determination voltage and the second type determination voltage.

12. The insulation resistance detection apparatus according to claim 1, further comprising:
a start-up determiner configured to determine whether a current sampling timing of the value of the detection voltage is during start-up of the power supply system, wherein:
the resistance determiner is configured to prevent determination of whether there is a leakage of current between the ground portion and the power-supply path in response to determination that the current sampling timing of the value of the detection voltage is during start-up of the power supply system.

13. The insulation resistance detection apparatus according to claim 12, further comprising:
a voltage obtainer configured to obtain a power-supply voltage of the direct-current power source, wherein:
the resistance determiner is configured to determine a length of a prevention time period during which determination of whether there is a leakage of current between the ground portion and the power-supply path is prevented.

* * * * *